US006211741B1

(12) United States Patent
Dalmia

(10) Patent No.: US 6,211,741 B1
(45) **Date of Patent: *Apr. 3, 2001**

(54) CLOCK AND DATA RECOVERY PLL BASED ON PARALLEL ARCHITECTURE

(75) Inventor: Kamal Dalmia, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/302,214

(22) Filed: Apr. 29, 1999

Related U.S. Application Data

(60) Provisional application No. 60/104,486, filed on Oct. 16, 1998.

(51) Int. Cl.[7] ..................................................... H03L 7/087

(52) U.S. Cl. .............................. 331/11; 331/1 A; 331/12; 375/376; 327/147

(58) Field of Search .................................... 375/374, 376; 331/1 A, 25, 11, 12; 327/147, 156, 158, 159; 455/260

(56) References Cited

U.S. PATENT DOCUMENTS

| | | | |
|---|---|---|---|
| 4,871,975 * | 10/1989 | Nawata et al. | 329/124 |
| 5,138,281 | 8/1992 | Boudewijns | 331/1 A |
| 5,384,551 | 1/1995 | Kennedy et al. | 331/17 |
| 5,436,938 | 7/1995 | Pigeon | 375/376 |
| 6,075,416 * | 6/2000 | Dalmia | 331/25 |

OTHER PUBLICATIONS

A 0.8–μm CMOS 2.5 Gb/s Oversampling Receiver and Transmitter for Serial Links, By: Chih–Kong Ken Yang and Mark A. Horowitz, IEEE Journal of Solid–State Circuits, vol. 31, No. 12, Dec. 1996, pp. 2015–2023.

FP 15.3: A 1.25Gb/s, 460 mW CMOS Transceiver for Serial Data Communication, By: Dao–Long Chen, Michael O. Baker, 1997 IEEE International Solid–State Circuits Conference, pp. 242–243.

FP 15.1: A 1.0625Gbps Transceiver with 2x–Oversampling and Transmit Signal Pre–Emphasis, By: Alan Fiedler, Ross Mactaggart, James Welch, Shoba Krishnan, 1997 IEEE International Solid–State Circuits Conference, pp. 238–239.

Mohammad Navabi et al., U.S.S.N. 08/878,714 Phase Locked Loop (PLL) with Linear Parallel Sampling Phase Detector, filed Jun. 19, 1997.

Mohammad Navabi et al., U.S.S.N. 08/879,287, Phase Detector with Linear Output Response, filed Jun. 19, 1997.

Kamal Dalmia, U.S.S.N. 09/302,213, Phase Detector with Extended Linear Range, filed Apr. 29, 1999.

Kamal Dalmia, U.S.S.N. 09/283,058, Method, Architecture and Circuit for Half–Rate Clock and/or Data Recovery, filed Apr. 1, 1999.

Kamal Dalmia et al., U.S.S.N. 09/216,465, Phase Detector, filed Dec. 18, 1998.

* cited by examiner

*Primary Examiner*—Arnold Kinkead
(74) *Attorney, Agent, or Firm*—Christopher P. Maiorana, P.C.

(57) ABSTRACT

An apparatus comprising a first circuit and a clock circuit. The first circuit may be configured to generate an output signal and a re-timed data signal in response to (i) a data input signal, (ii) a first clock signal and (iii) a second clock signal. The clock circuit may be configured to generate the first and second clock signals in response to the output signal.

14 Claims, 3 Drawing Sheets

CLOCK AND DATA RECOVERY PLL BASED ON PARALLEL ARCHITECTURE

CROSS-REFERENCE TO RELATED APPLICATIONS

The present invention may relate to and claims benefit of Provisional application Serial. No. 60/104,486, filed Oct. 16, 1998, and Ser. No. 09/216,465, filed Dec. 18, 1998 now U.S. Pat. No. 6,072,237, Ser. No. 09/283,058, filed Apr. 1, 1999, now U.S. Pat. No. 6,075,416 and Ser. No. 09/302,213, Apr. 29, 1999 and now U.S. Pat. No. 6,075,388, which are each hereby incorporated by reference in their entirety.

FIELD OF THE INVENTION

The present invention relates to a linear clock and data recovery circuits generally and, more particularly, to a circuit and/or method that may recover one or more half-rate clock signals from a serial input data stream.

BACKGROUND OF THE INVENTION

Phase-Lock Loops (PLLs) are circuits that may be used to recover clock signals from serial data-bit streams and/or to generate re-timed data. As operating speeds of clock and data recovery circuits increases, the design of PLL components (e.g., a voltage-controlled oscillator (VCO), a phase-detector (PD) and/or a divider) becomes more complicated and consumes more power. Some architectures use multiple phases of a lower-rate clock but feature non-linear characteristics or reduced linear range.

Referring to FIG. 1, a circuit 10 is shown illustrating a conventional data recovery circuit. The circuit 10 generally comprises phase detector 12, a phase frequency detector 14, a divider 16, a VCO 18 and a CPF 20.

The VCO 18 generates a full-rate clock which is divided by "N" by the divider FBDIV 16. The divided down clock signal CLK_DIV is presented to the phase-frequency detector 14. The PFD 14 also receives a reference clock signal REFCLK_IN which is typically a divided by N version of the data signal. The PFD 14 compares the signals REFCLK_IN and CLK_DIV and generates a pump-up and a pump-down signal. The pump-up and pump-down signals are presented to the charge-pump/filter 20 through a multiplexer controlled by a signal LLC. The signal LLC controls the "locking" of the circuit 10 to the signal REFCLK_IN or the signal DATA. When the circuit 10 is frequency locked to the signal REFCLK, the multiplexer 22 is switched to select the signal DATA (through the PD 12) for the closed loop by using the signal LLC. The close loop-with the PD 12 then locks the signal DATA and generates recovered data and clock signals. This implementation requires the use of a full-rate PD 12 and a full-rate VCO 18. The VCO 18 generates a single phase of the clock. The divider FBDIV 16 is also a full-rate single-phase divider.

The circuit 10 has the disadvantage that is (i) requires full rate components such as the phase-detector and the VCO, (ii) requires a linear full-rate phase-detector, and/or (iii) has a full-rate operation that implies higher power components are required.

SUMMARY OF THE INVENTION

The present invention concerns an apparatus comprising a first circuit and a clock circuit. The first circuit may be configured to generate an output signal and a re-timed data signal in response to (i) a data input signal, (ii) a first clock signal and (iii) a second clock signal. The clock circuit may be configured to generate the first and second clock signals in response to the output signal.

The objects, features and advantages of the present invention include providing a data recovery circuit that may (i) enable higher data rate linear PLLs in existing integrated-circuit technologies (for a given performance level), (ii) be implemented using half-rate components that may consume less power, (iii) be implemented with linear phase-detectors having extended linear range that may provide better jitter performance, (iv) provide a clock and data recovery PLL utilizing a half-rate clock and its quadrature, (v) provide a PLL utilizing a half-rate clock and its quadrature with linear phase-difference vs. gain characteristics, (vi) provide a linear PLL comprising two phase detectors each working on one edge of data, (vii) provide a PLL comprising three charge pumps circuits (e.g., two for each of the two phase detectors and one for the PFD) and/or (viii) provide a PLL comprising a four phase quarter rate VCO and XOR gates to generate respective half-rate clocks.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 2:
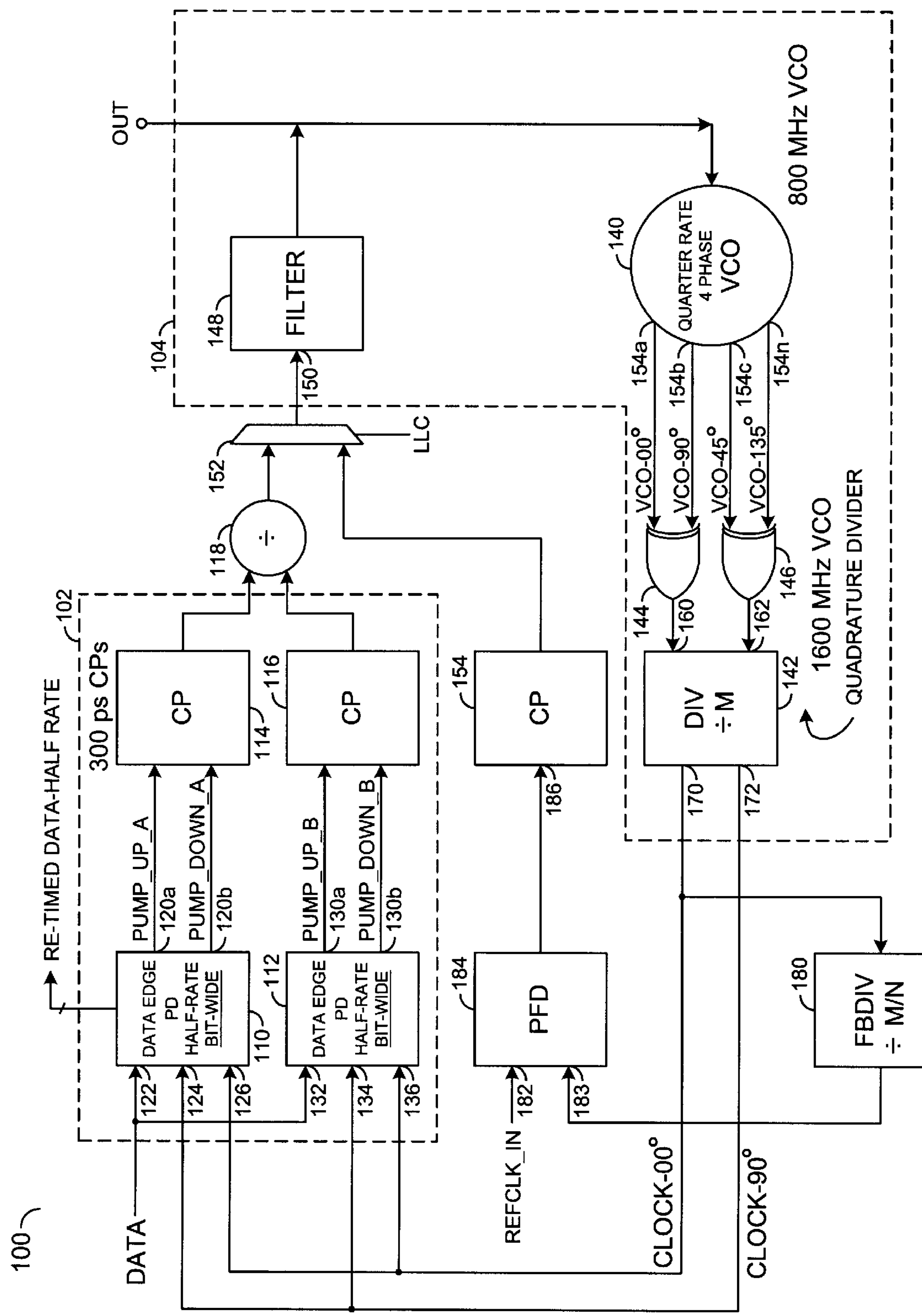
FIG. 2 is a block diagram of a preferred embodiment of the present invention.

Referring to FIG. 2, a block diagram of a circuit 100 is shown in accordance with a preferred embodiment of the present invention. The circuit 100 may be implemented as a phase locked loop (PLL). The circuit 100 generally comprises a first section 102 and a second section 104. The first section 102 generally comprises a phase detector 110, a phase detector 112, a charge pump 114, a charge pump 116 and a device 118. The device 118 may be a summing device that generally adds the two charge pump outputs. The device 118 may be implemented as a digital OR gate, an analog mechanism to add two currents or voltages, or any other appropriate summing device. The phase detector 110 may be implemented, in one example, as a half-rate phase detector (to be described in more detail in connection with FIG. 3). Similarly, the phase detector 112 may be implemented as a half-rate phase detector. The phase detector 110 generally presents a set of signals (e.g., PUMP_UP_A and PUMP_DOWN_A) at an output 120*a* and 120*b* in response to a data input signal (e.g., DATA) received at an input 122, a first clock signal (e.g. CLOCK-90°) received at an input 124 and a second clock signal (e.g., CLOCK-00°) received at an input 126. The phase detector 112 generally presents a set of signals (e.g., PUMP_UP_B and PUMP_DOWN_B) at an output 130*a* and 130*b* in response to the signal DATA received at an input 132, the first clock signal received at an input 134 and the second clock signal received at an input 136.

The circuit 104 generally comprises a voltage control oscillator (VCO) 140, a divider circuit 142, a gate circuit 144, a gate circuit 146 and a filter circuit 148. In one example, the gate circuits 144 and 146 may be implemented as XOR gates. However, other gates may be implemented accordingly to meet the design criteria of a particular implementation. The filter circuit 148 generally comprises an input 150 that may receive a signal from the block 118. In one example, a selector device 152 may present either the signal received from the device 118 or a signal received from a charge pump 154. However, the selector device 152 and the charge pump 154 are optional components that may be used to present an alternate path to the input 150. The filter 148 generally presents a signal (e.g., OUT) that may be received by the VCO 140.

The VCO 140 may present a number of output clock signals (e.g., VCO-00°, VCO-90°, VCO-45° and VCO-135°) at a number of outputs 154*a*–154*n*, respectively. The gate 144 may present a signal to an input 160 of the divider circuit 142 in response to two of the outputs (e.g., the signal VCO-00° and the signal VCO-90°). The gate 146 present a signal to an input 162 of the divider 142 in response to another two of the outputs of the VCO (e.g., VCO-45° and VCO-135°). The divider 142 may present the clock signal CLOCK-00° at an output 170 and clock signal CLOCK-90° and an output 172.

An optional feedback divider circuit 180 may receive the signal CLOCK-00° and present a divided version of the signal CLOCK-00° to an input 182 of a phase frequency detector 184. The phase frequency detector 184 may present a signal to an input 186 of the charge pump 154 in response to the signal received at the input 182 and a reference clock signal (e.g., REFCLK_IN) received at an input 183.

The circuit 100 may use the two half-rate linear phase-detectors 110 and 112, the quarter rate VCO 140, the two XOR gates 144 and 146, the three charge pumps 114, 116 and 186, the quadrature divider 142 and the single phase divider feedback divider 180 to greater the retimed data and the signal OUT. The PFD 184 and the multiplexer 152 may be similar to conventional circuits.

The VCO 140 may generate the four quarter rate clocks that are 90 degrees apart in phase. The four quarter rate clocks VCO-00°, VCO-90°, VCO-45° and VCO-135° may be presented to the two XOR gates 144 and 146 to generate two half-rate quadrature clocks presented to the inputs 160 and 162, respectively. In one example, the VCO 140 may be implemented to directly generate the two half-rate quadrature clocks presented to the inputs 160 and 162. The two half-rate quadrature clocks may then be divided by M by the quadrature divider 142 to generate the signals CLOCK-00° and CLOCK-90°. The divider 180 divides the signal CLOCK-00° (or CLOCK-90°) by M/N, thus providing an effective division by N. In general, N and M are integers that may be used to operate the PLL 100 at different rates. The signal REFCLK_IN is generally a divide-by-N version of the input data rate. Thus the close loop with the PFD 184 is effectively the same as conventional approaches. Once the circuit 100 is frequency locked to the signal REFCLK_IN, the loop may be configured to recover data with the PD (110 or 112) in the loop by switching the multiplexer 152 using the signal LLC. When the circuit 100 is in a data recovery mode, both clock signals CLOCK-00° and CLOCK-90° are used by the two linear half-rate phase-detectors 110 and 112.

The phase detectors 110 and 112 may generate nominally bit-wide pump-up and pump-down signals for each rising and falling edge of data at the outputs 120 and 130, respectively. The pump signals from the phase detectors 110 and 112 may be fed to the charge-pump circuits 114 and 116, respectively. Since the width of the pump signals presented by the phase detectors 110 and 112 may be twice the width of conventional signals, the requirements on charge pump performance is half as much as that of a traditional charge pump.

Figure 3:
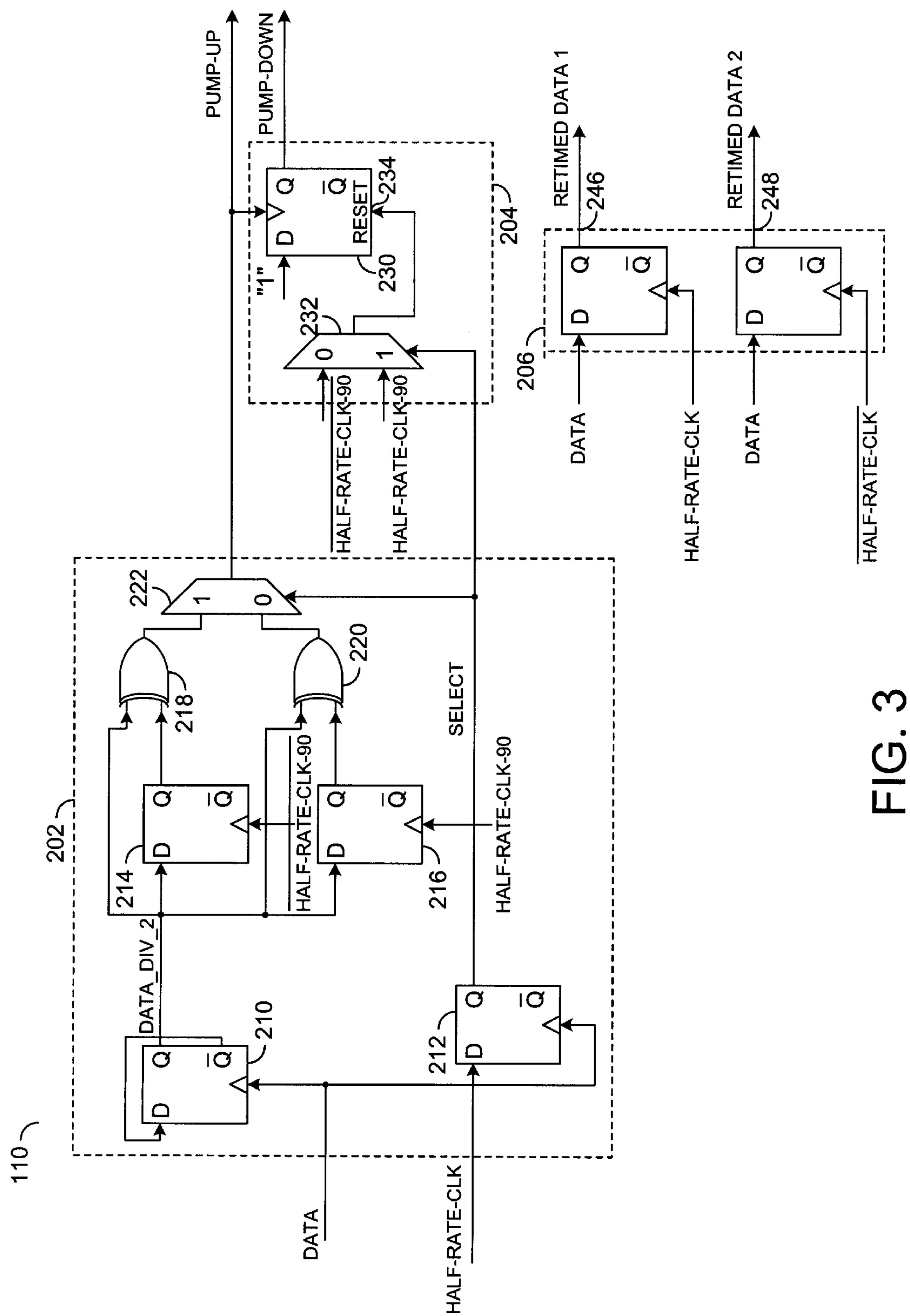
FIG. 3 is a diagram illustrating an example of a half-rate linear phase detector.

Referring to FIG. 3, an example of an implementation of a half-rate linear phase-detector can 110 (or 112) is shown. A more detailed description of the half-rate phase detector 110 can be found in co-pending application, Ser. No. 09/302,213, filed on Apr. 29, 1999, which is hereby incorporated by reference in its entirety. The phase detector 110 generally operates on a single edge of the signal DATA. To retain phase information in both edges of the signal DATA, the phase detector 110 is replicated a second time as the phase detector 112 in the architecture 100.

The circuit 110 generally comprises a pump-up section 202, a pump-down section 204 and a data recovery section 206. The pump-up section 202 generally comprises a flip-flop 210, a flip-flop 212, a flip-flop 214, a flip-flop 216, a gate 218, a gate 220 and a multiplexer 222. The flip-flops 210, 212, 214 and 216 may be implemented, in one example, as D-type flip-flops. Alternatively, the flip-flops 210, 212, 214 and 216 may be implemented as T-type flip-flops. The flip-flop 210 and the flip-flop 212 generally receive a data input signal (e.g., DATA) at respective clock inputs. The flip-flop 210 generally presents a signal (e.g., DATA_DIV_2) at a Q output. A Qb output (e.g., a digital complement of the Q output) is generally presented to the D input of the flip-flop 210. The signal DATA_DIV_2 is generally presented to a D input of the flip-flop 214, a first input of the gate 218, a first input of the gate 220 and the input of the gate 216. In one example, the gates 218 and 220 may be implemented as XOR gates. However, other gates may be implemented accordingly to meet the design criteria of a particular implementation.

The flip-flop 216 generally receives a quadrature (e.g., HALF-RATE_CLK-90) of the signal presented to the flip-flop 212. A quadrature signal is generally referred to as a signal that is phase shifted 90°. The flip-flop 214 generally receives a digital complement of the signal presented to the clock input of the flip-flop 216 (e.g., HALF-RATE_CLK-90). The flip-flop 214 has an output that generally presents a signal to a second input of the gate 218. Similarly, the flip-flop 216 has an output that is generally presented to a second input of the gate 220. The gate 218 generally presents a signal (e.g., an internal pump-up signal PUMP_UP_A) to a first input of the multiplexer 222. The gate 220 generally presents a signal (e.g., an internal pump-up signal PUMP_UP_B) to a second input of the multiplexer 222. The flip-flop 212 generally presents a signal (e.g., SELECT) to a control input of the multiplexer 222. The signal SELECT is generally a gated (or sampled) version of the signal HALF-RATE_CLK.

The pump-down circuit 204 generally comprises a flip-flop 230 and a multiplexer 232. The flip-flop 230 may be, in one example, a D-type flip-flop with a reset input. The multiplexer 232 generally receives the signal SELECT at a control input, the signal HALF-RATE_CLK-90 at a first input and the signal HALF-RATE_CLK-90 at a second input. The multiplexer 232 generally presents a signal to an input 234 of the flip-flop 230. The input 234 may be a reset input. The flip-flop 230 generally receives a digital high or a "1" at an input. The clock input of the flip-flop 230 generally receives the signal PUMP-UP. The output of the flip-flop 230 generally presents a signal (e.g., PUMP-DOWN).

The recovery section 206 generally comprises a flip-flop 242 and a flip-flop 244. The flip-flop 242 generally receives the signal HALF-RATE_CLK at a clock input, the signal DATA at a data input and may present a retimed data signal at an output 246. The flip-flop 244 generally receives the signal HALF-RATE_CLKb at a clock input, the signal DATA at a D input and may present a retimed data signal at an output 248.

In general, the circuit 100 provides a 2× parallel sampling phase-detector that generally responds to the signal HALF-RATE_CLK and HALF-RATE_CLK-90. The flip-flop 210 may act as a data divider to generate the signal DATA_DIV_2, which generally has edges that respond to one edge (e.g., the rising edge) of the signal DATA. The signal DATA_DIV_2 may be used to generate the signals PUMP_UP_A or PUMP_UP_B for each edge. The flip-flop 214 and the XOR gate 218 may be used to generate the signal PUMP_UP_A. The flip-flop 216 and the XOR gate 220 may be used to generate the signal PUMP_UP_B. Depending on the polarity of the signal DATA and the signal HALF-RATE_CLK, one of the internal pump signals PUMP_UP_A or PUMP_UP_B may be selected by the multiplexer 222 as the final signal PUMP_UP.

The generation of the signal PUMP_UP and selection may be implemented, in one example, by the following method: (i) generate a positive transition for each edge of the signal DATA_DIV_2, (ii) generate the internal pump-up signal PUMP_UP_A using the signal HALF-RATE_CLK-90 and the internal pump-up signal PUMP_UP_B in response to the signal HALF-RATE_CLK-90b, (iii) sample the signal HALF-RATE_CLK with the signal DATA, (iv) if the signal HALF-RATE_CLK is sampled HIGH by the flip-flop 212, use the multiplexer 222 to select the internal pump-up signal PUMP_UP_A (e.g., the signal generated by the flip-flop 214 and the gate 218), and (v) if the signal HALF-RATE_CLK is sampled LOW by the flip-flop 212, use the multiplexer 222 to select the internal pump-up signal PUMP_UP_B (e.g., the signal generated by the flip-flop 216 and the gate 220).

The signal PUMP-DOWN may be generated, in one example, by the following method: (i) if the signal HALF-RATE_CLK is sampled HIGH by the flip-flop 212, use the multiplexer 232 to select HALF-RATE_CLK-90 to generate the signal PUMP-DOWN, (ii) if the signal HALF-RATE_CLK is sampled LOW by the flip-flop 212, use the multiplexer 232 to select the signal HALF-RATE_CLK-90b to generate the signal PUMP-DOWN, (iii) start the signal PUMP-DOWN on the one edge (e.g., the falling edge) of the signal PUMP-UP using the flip-flop 230, and (iv) stop the signal PUMP-DOWN in response to the signal HALF-RATE_CLK-90 or the signal HALF-RATE_CLK-90b selected in step (i) or (ii).

Figure 1:
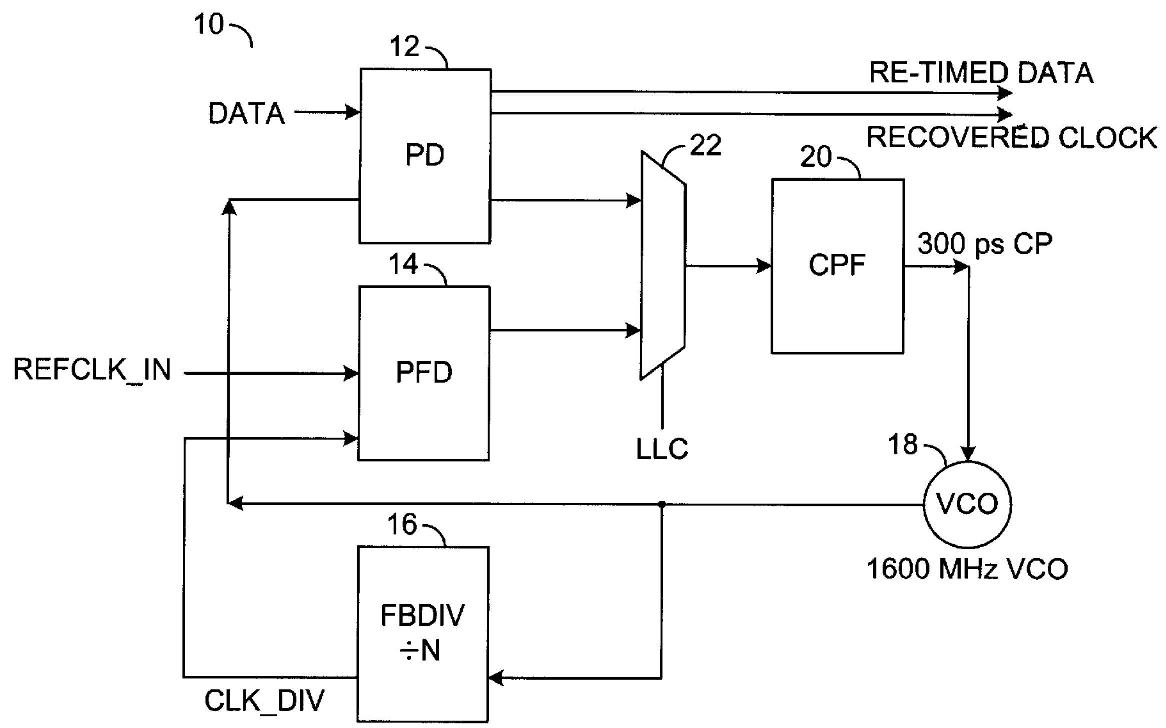
FIG. 1 is a block diagram of a conventional data recovery circuit.
Figure 4:
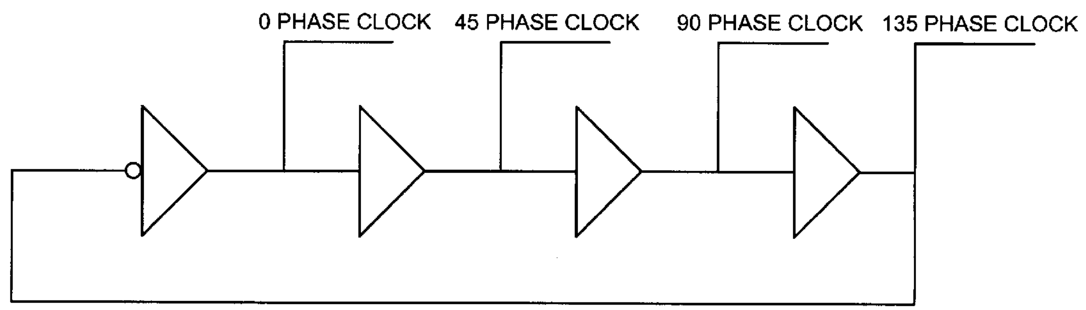
FIG. 4 is a diagram of an example of a VCO configured to generate the quadrature signals used in FIG. 2.

Referring to FIG. 4, an example of an implementation of the VCO 140 generating the half-rate quadrature clocks used in FIG. 2 is shown. The VCO 140 may be implemented as a classic ring-oscillator VCO. The 0, 45, 90 and 135 degree phases of the clock (i.e., the signals VCO-00°, VCO-90°, VCO-45° and VCO-135° may be generated from the VCO 140 as shown.

While the circuit 100 has been described in connection with a quarter-rate, four-phase VCO 140, other examples of VCOs may be implemented accordingly to meet the design criteria of a particular application. For example, an 1/N rate N-phase VCO, where N is an integer, may be implemented in particular design applications. In such an example, N-number of outputs 154_a–n_ would be presented. Additionally, the circuit 100 has been described in connection with two half-rate phase detectors that each receive the signal CLOCK-00° and CLOCK-90°. In the N-rate VCO example, the number of phase detectors may be increased to N/2 and the number of clocks may be increased to N/2. As a result, the parallel nature of the present invention may be expanded to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

a first circuit configured to generate an output signal and a re-timed data signal in response to (i) a data input signal, (ii) a first clock signal and (iii) a second clock signal; and a clock circuit configured to generate said first and second clock signals in response to said output signal, wherein said clock circuit comprises (i) an N-rate VCO configured to generate N-subclocks and (ii) N/2 gates configured to generate said first and second clocks in response to said N-subclocks.

2. The apparatus according to claim 1, wherein said first circuit comprises N/2 phase detectors.

3. The apparatus according to claim 2, wherein said N/2 phase detectors operate at an N/2 bit rate.

4. The apparatus according to claim 2, wherein at least one of said phase detectors operates on a first edge of said data input signal and another one of said phase detectors operates on a second edge of said data input signal.

5. The apparatus according to claim 3, wherein said first circuit further comprises an N/2 rate charge pump.

6. The apparatus according to claim 1, wherein:

said N-rate VCO comprises a quarter rate VCO; and said N/2 gates comprise two or more gates.

7. The apparatus according to claim 6, wherein said first circuit further comprises:

a first half-rate phase detector and a second half-rate phase detector.

8. The apparatus according to claim 7, wherein said first phase detector operates on a first edge of said data input signal and said second phase detector operates on a second edge of said data input signal.

9. The apparatus according to claim 5, wherein said first circuit further comprises a half-rate charge pump.

10. An apparatus comprising:

means for generating an output signal and a re-timed data signal in response to (i) a data input signal, (ii) a first clock signal and (iii) a second clock signal; and means for generating said first and second clock signals in response to said output signal, wherein means for generating said first and second clock signals comprises (i) an N-rate VCO configured to generate N-subclocks and (ii) N/2 gates configured to generate said first and second clocks in response to said N-subclocks.

11. A method for clock and data recovery comprising the steps of:

(A) generating an output signal and a re-timed data signal in response to (i) a data input signal, (ii) a first clock signal and (iii) a second clock signal;

(B) generating N-subclocks; and (C) generating said first and second clock signals in response to said output signal and said N-subclocks.

12. The method according to claim 11, wherein said first and second clock signals are generated with a voltage controlled oscillator.

13. The method according to claim 11, wherein step (A) generates said output signal and said re-timed data signal using N/2 phase detectors.

14. The method according to claim 13, wherein said N/2 phase detectors operate at an N/2 bit rate.

* * * * *